United States Patent
Kaga et al.

(10) Patent No.: US 8,472,248 B2
(45) Date of Patent: Jun. 25, 2013

(54) SEMICONDUCTOR MEMORY AND CONTROL METHOD THEREOF

(75) Inventors: Hiroyuki Kaga, Yokohama (JP); Masahiro Yoshihara, Yokohama (JP); Naofumi Abiko, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/235,430

(22) Filed: Sep. 18, 2011

(65) Prior Publication Data

US 2012/0250409 A1    Oct. 4, 2012

(30) Foreign Application Priority Data

Mar. 30, 2011    (JP) .................................. 2011-076287

(51) Int. Cl.
*G11C 11/34* (2006.01)
(52) U.S. Cl.
USPC .................................................... 365/185.05
(58) Field of Classification Search
USPC .................................................... 365/185.05
See application file for complete search history.

(56) References Cited

U.S. PATENT DOCUMENTS 7,324,389 B2 * 1/2008 Cernea ..................... 365/189.05
2011/0141823 A1 * 6/2011 Takagiwa ................. 365/189.05

FOREIGN PATENT DOCUMENTS

JP    61-227295    10/1986
JP    6-20487    1/1994

* cited by examiner

*Primary Examiner* — Anthan Tran
(74) *Attorney, Agent, or Firm* — Oblon, Spivak, McClelland, Maier & Neustadt, L.L.P.

(57) ABSTRACT

According to one embodiment, a semiconductor memory includes a memory cell array which includes memory cells, the memory cells being arranged along a row direction and a column direction and storing data respectively corresponding to thresholds, a row control circuit which controls a row of the memory cell array, and a column control circuit which includes a control unit, the control unit generating a signal to control elements corresponding to column of the memory cell array in accordance with a pointer corresponding to an external address signal.

17 Claims, 10 Drawing Sheets

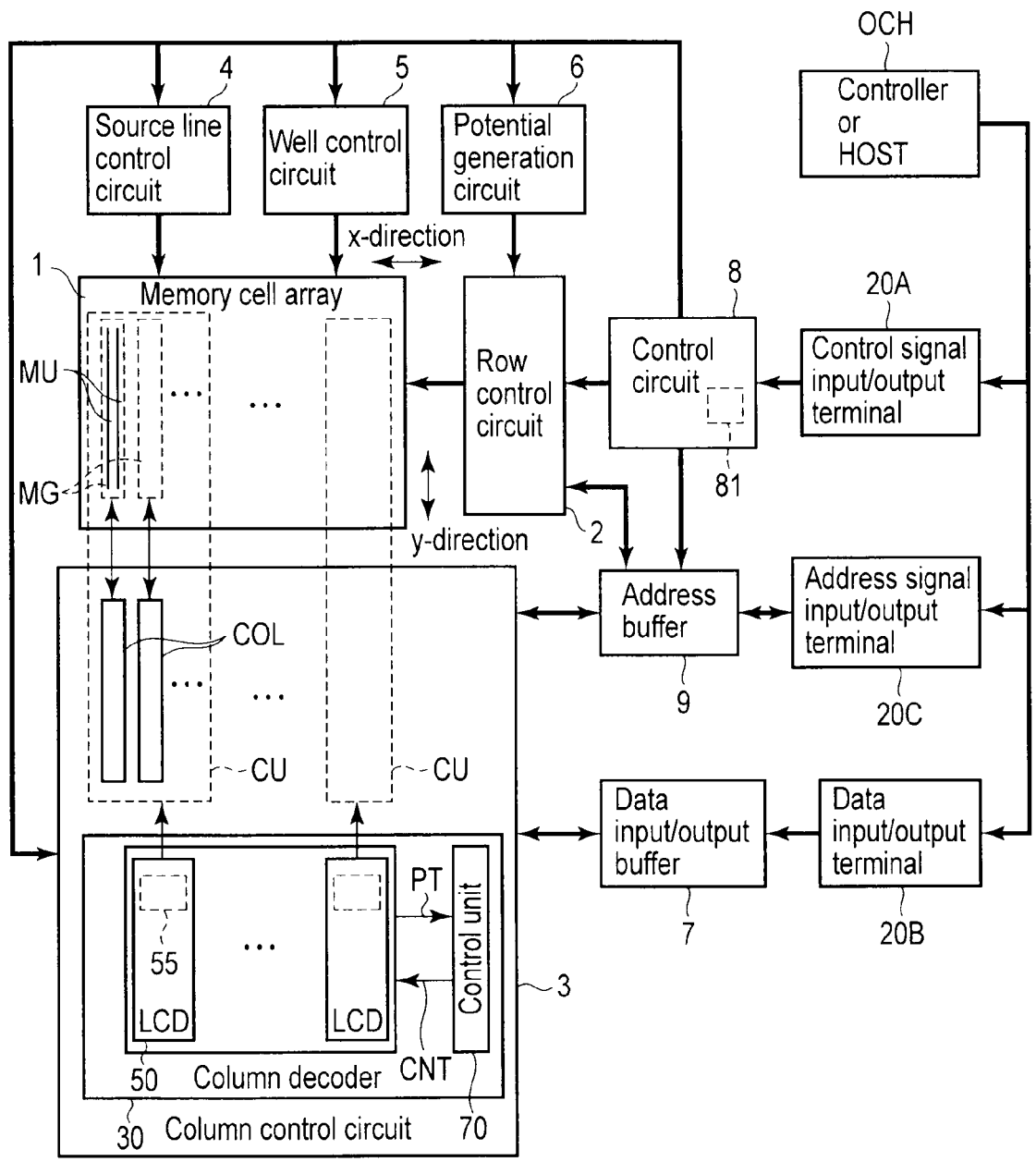
F I G. 1

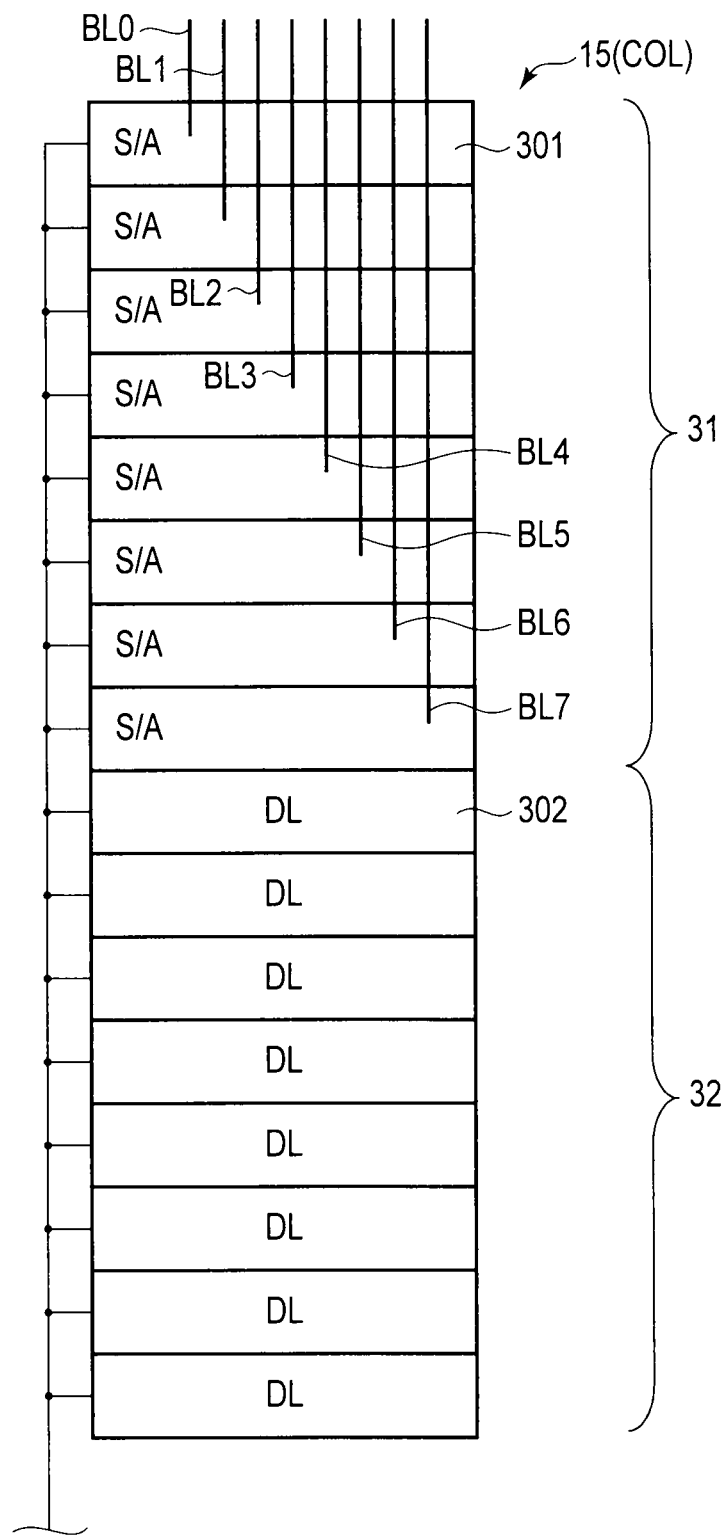
F I G. 3

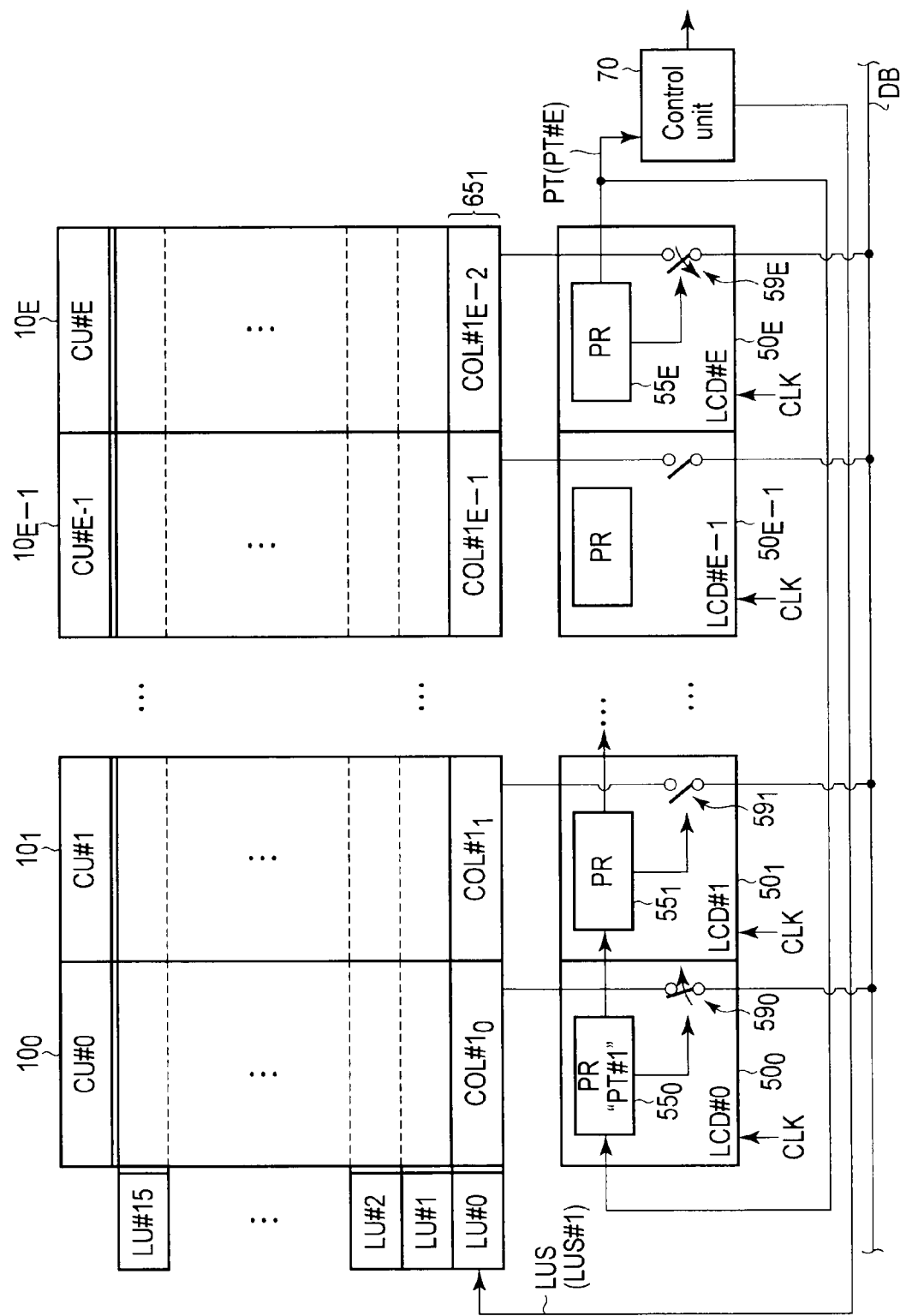
F I G. 7

SEMICONDUCTOR MEMORY AND CONTROL METHOD THEREOF

CROSS-REFERENCE TO RELATED APPLICATIONS

This application is based upon and claims the benefit of priority from prior Japanese Patent Application No. 2011-076287, filed Mar. 30, 2011, the entire contents of which are incorporated herein by reference.

FIELD

Embodiments described herein relate generally to a semiconductor memory and a control method thereof.

BACKGROUND

Recently, flash memories have been used as primary storage devices in various electronic devices along with, for example, HDDs and CDs/DVDs.

For example, the increase of data input/output speed, the improvement of operation reliability, and the reduction of manufacturing costs are required for the flash memories.

BRIEF DESCRIPTION OF THE DRAWINGS

FIG. 1 is a block diagram showing an example of a circuit configuration of a semiconductor memory;

FIG. 3 is a schematic diagram showing a configuration example of the semiconductor memory and a column control circuit;

FIG. 7 is a diagram schematically showing the operation of the semiconductor memory according to the first embodiment;

DETAILED DESCRIPTION

[Embodiments]

A semiconductor memory according to embodiments is described below in detail with reference to FIG. 1 to FIG. 10. Elements having the same function and configuration are given the same reference signs below, and repeated explanations are given when necessary.

In general, according to one embodiment, a semiconductor memory includes a memory cell array which includes memory cells, the memory cells being arranged along a row direction and a column direction and storing data respectively corresponding to thresholds; a row control circuit which controls a row of the memory cell array; and a column control circuit which includes a control unit, the control unit generating a signal to control elements corresponding to a column of the memory cell array in accordance with a pointer corresponding to an external address signal.

(1) First Embodiment

A semiconductor memory according to the first embodiment is described with reference to FIG. 1 to FIG. 8.

(a) Configuration

The configuration and function of the semiconductor memory according to the first embodiment is described with reference to FIG. 1 to FIG. 4.

FIG. 1 is a block diagram showing the major components in the configuration of the semiconductor memory according to the first embodiment. The semiconductor memory according to the present embodiment is, for example, a nonvolatile semiconductor memory, and more specifically, a flash memory by way of example.

A memory cell array 1 has memory cells.

The internal configuration of the memory cell array 1 in FIG. 1 is described with reference to FIG. 2.

When the flash memory shown in FIG. 1 is, for example, a NAND-type flash memory, the memory cell array 1 has blocks BLK. The block BLK indicates the minimum unit of erasure.

Figure 2:
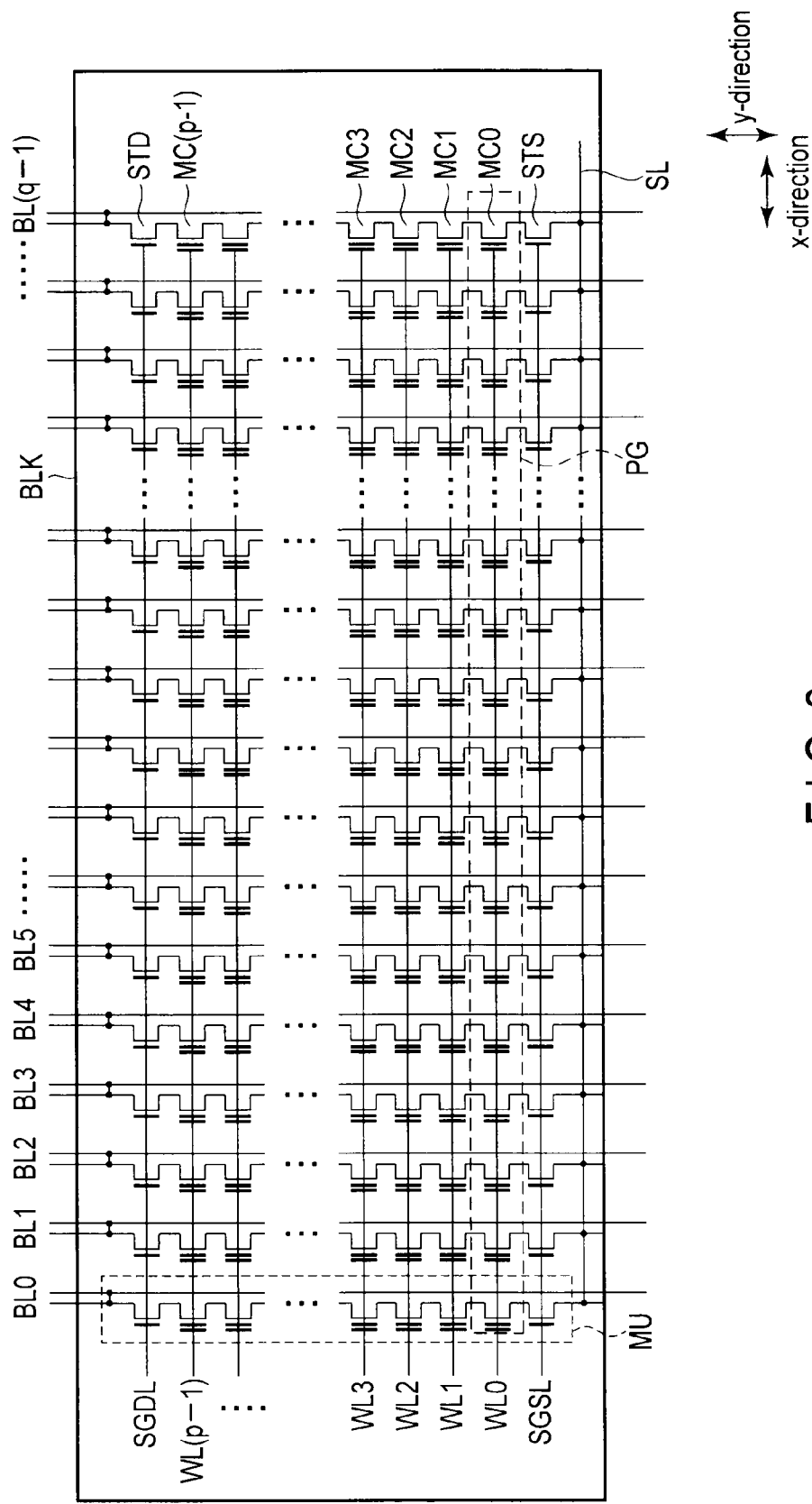
FIG. 2 is an equivalent circuit diagram showing an example of the internal configuration of a memory cell array.

FIG. 2 is an equivalent circuit diagram showing the circuit configuration of one block BLK. One block BLK includes memory cell units MU arranged in an x direction (first direction, row direction). For example, q memory cell units MU are provided in one block BLK.

One memory cell unit MU includes a memory cell string formed of (e.g., p) memory cells MC0 to MC(p−1), a first select transistor STS (hereinafter referred to as a source-side select transistor) connected to one end of the memory cell string, and a second select transistor STD (hereinafter referred to as a drain-side select transistor) connected to the other end of the memory cell string. In the memory cell string, current paths of the memory cells MC0 to MC(p−1) are connected in series along a y direction (second direction, column direction).

A source line SL is connected to one end (source side) of the memory cell unit MU, more specifically, one end of a current path of the source-side select transistor STS. A bit line BL is connected to one end (drain side) of the memory cell unit MU, that is, one end of a current path of the drain-side select transistor STD.

The number of memory cells that form one memory cell unit MU has only to be two or more, and may be, for example, 16, 32, or 64 or more. Hereinafter, the memory cells MC0 to MC(p−1) are represented by memory cells MC when not distinguished from one another.

The memory cell MC is a field effect transistor of a stack gate structure having a charge storage layer (e.g., a floating gate electrode, or an insulating film including a trap level). The source/drain of two memory cells MC adjacent in the y direction are connected to each other, and the current paths of the memory cells MC are connected in series. Thus, the memory cell string including the memory cells is formed.

The drain of the source-side select transistor STS is connected to the source of the memory cell MC0. The source of the source-side select transistor STS is connected to the source line SL. The source of the drain-side select transistor is connected to the drain of the memory cell MC(p−1). The drain of the drain-side select transistor STD is connected to bit lines BL0 to BL(q−1). The number of the bit lines BL0 to BL(q−1) is the same as the number of the memory cell units MU in the block BLK.

Word lines WL0 to WL(p−1) extend in the x direction, and each of the word lines WL0 to WL(p−1) is shared by and connected to the gates of the memory cells MC arranged along the x direction. In one memory cell unit MU, the number of the word lines is the same as the number of the memory cells included in one memory cell string.

A drain-side select gate line SGDL extends in the x direction, and is shared by and connected to the gates of the drain-side select transistors STD arranged along the x direction. A source-side select gate line SGSL extends in the x direction, and is shared by and connected to the gates of the source-side select transistors STS arranged along the x direction.

Hereinafter, the bit lines BL0 to BL(q−1) are represented by bit lines BL when not distinguished from one another, and the word lines WL0 to WL(p−1) are represented by word lines WL when not distinguished from one another.

Each of the memory cells MC stores external data by associating the intensity of a threshold voltage of the transistor (the distribution of the threshold voltage) with the data.

Each of the memory cells MC stores data comprising two values (1 bit) or three values (2 bits) or more.

For example, when one memory cell MC stores two-value (1-bit) data "0" and "1", the memory cell MC has two threshold distributions corresponding to these data. When one memory cell MC stores four-value (2-bit) data "00", "01", "10", and "11", the memory cell MC has four threshold distributions corresponding to these data. A memory cell in which data having three or more values is stored is also referred to as a multi-level memory.

Data is collectively written into the memory cells MC connected to the same word line WL. Data is collectively read from the memory cells MC connected to the same word line WL. A control unit of data writing/reading is referred to as a page PG.

Data is written into the multi-level memory per low bit or per high bit. Data in the multi-level memory is also read per low bit or per high bit. Therefore, when the memory cell MC holds MC 2-bit data, two pages are allocated to one word line WL. A page collectively written (or a page read) per low bit is referred to as a low page. A page collectively written (or a page read) per high bit is referred to as a high page.

A row control circuit 2 controls rows of the memory cell array 1. The row control circuit 2 is connected to the word lines and the select gate lines provided in the memory cell array 1. The row control circuit 2 has a row decoder and a driver. The block BLK and the page PG are selected on the basis of an address signal transferred from an address buffer 9. The row control circuit 2 then controls the operations (potentials) of the word lines and the select gate lines.

A column control circuit 3 controls a column of the memory cell array 1.

A source line control circuit 4 controls the potential of the source line SL connected to the memory cell unit MU.

A well control circuit 5 controls the potential of a well region in the memory cell array 1.

A potential generation circuit 6 generates a write voltage, a read potential, an intermediate potential, and an unselect potential applied to each of the word lines WL in data writing (programming), in data reading, and in erasing. The potential generation circuit 6 also generates, for example, potentials applied to the select gate lines SGDL and SGSL. The potentials generated by the potential generation circuit 6 are input to the row control circuit 2, and respectively applied to a selected word line, unselected word lines, and the select gate line. The potential generation circuit 6 generates a potential applied to the source line SL and a potential applied to the well region. The potential generation circuit 6 transfers the generated potentials to the source line control circuit 4 and the well control circuit 5.

A data input/output buffer 7 serves as a data input/output interface. The data input/output buffer 7 temporarily holds external data input via a data input/output terminal 20B. The data input/output buffer 7 temporarily holds data output from the memory cell array 1, and outputs the held data to the data input/output terminal 20B in accordance with a predetermined timing.

The address buffer 9 temporarily holds an address signal input via an address signal terminal 20C. The external address signal is a physical address, and includes a physical row address and a physical column address.

A control circuit (e.g., a state machine) 8 manages the operation of the overall flash memory. The control circuit 8 receives a control signal input from a control signal input terminal 20A. This control signal is output from, for example, a chip different from a memory chip such as a memory controller (controller) OCH and/or a host device (host) OCH. For example, the control circuit 8 includes a command interface.

A column decoder 30 in the column control circuit 3 includes local column decoders 50 and a control unit 70. The internal configuration of the column decoder 30 will be described later.

A sense amplifier circuit is connected to the bit lines BL provided in the memory cell array 1. In data reading (in outputting of data from the memory cell array), the sense amplifier circuit detects and amplifies a potential variation of the bit line BL, and determines the data stored in the memory cell MC. In data writing (in inputting of data to the memory cell array), the sense amplifier circuit controls the charging of the bit line BL and the discharging of the bit line.

A page buffer circuit temporarily stores data read from the memory cell array 1 and data to be written into the memory cell array 1.

The internal configuration of the column control circuit 3 and the connection between the memory cell array 1 and the column control circuit 3 are more specifically described with reference to FIG. 3 and FIG. 4 in addition to FIG. 1.

FIG. 3 is a diagram schematically showing the internal configuration of the column control circuit 3 included in the flash memory according to the present embodiment.

As shown in FIG. 3, a sense amplifier circuit 31 includes sense amplifier units 301.

For example, each of the sense amplifier units 301 is connected to one bit line BL. In data writing, the sense amplifier unit 301 charges or discharges a predetermined bit line BL under the control of the column decoder 30 and the control circuit 8. In data reading, the sense amplifier unit 301 amplifies and detects a potential variation of a predetermined bit line BL, and determines the data stored in the memory cell MC. The sense amplifier unit 301 may also function as a latch.

Depending on the method of sensing the bit line BL, one sense amplifier unit 301 may be shared by an even bit line and an odd bit line adjacent to each other. When the sense amplifier unit 301 is shared by two bit lines, the even and odd bit lines that share the sense amplifier unit 301 are connected to the sense amplifier unit 301 in accordance with different timings depending on the operation.

A page buffer circuit 32 includes data latch units 302. Each of the data latch units 302 is connected to one bit line BL via the sense amplifier unit 301 (sense amplifier circuit 31). The data latch unit 302 temporarily holds, for example, data to be written into the memory cell, data read from the memory cell, and setting information indicating the operation for the memory cell (hereinafter referred to as a flag). Each of the data latch units 302 also has a function for amplifying a signal from the sense amplifier unit 301 or an external signal.

Each of the data latch units 302 includes latches. When, for example, the memory cell MC stores 2-bit data, each of the data latch units 302 includes an upper data latch for holding upper 1-bit data, a lower data latch for holding lower 1-bit data, and a flag latch for holding a flag that indicates an operation mode. Each of the data latch units 302 may further includes a cache reading latch, and a latch for holding failure bit judgments.

The column decoder 30 includes local column decoders (LCD) $50_0$, $50_1$, $50_2$, ... $50_{E-1}$, and $50_E$, and the control unit 70.

The column decoder 30 causes, for example, the local column decoders $50_0$, $50_1$, $50_2$, ... $50_{E-1}$, and $50_E$ to control the operation of column of the memory cell array 1 by using, as one control unit, column units $10_0$, $10_1$, $10_2$, ... $10_{E-1}$, and $10_E$ set to the column of the flash memory (memory cell array). Each of the column units $10_0$(CU#0), $10_1$(CU#1), $10_2$(CU#2), ... $10_{E-1}$(CU#E−1), and $10_E$(CU#E) includes COLs (described later) adjacent in the x direction.

The local column decoders $50_0$, $50_1$, $50_2$, ... $50_{E-1}$, and $50_E$ are provided to correspond to the column units $10_0$, $10_1$, $10_2$, ... $10_{E-1}$, and $10_E$, respectively.

Hereinafter, the column units $10_0$, $10_1$, $10_2$, ... $10_{E-1}$, and $10_E$ are represented by column units 10 when not distinguished from one another, and the local column decoders $50_0$, $50_1$, $50_2$, ... $50_{E-1}$, and $50_E$ are represented by local column decoders 50 when not distinguished from one another.

Control units referred to as "COLs" are also formed by, for example, the sense amplifier units 301 and the data latch units 302. Here, the COLs of each of the column units 10 are represented by COL#15, COL#14, ..., and COL#0. Here, a set MG of memory cell units MU (referred to as a memory group) is provided in each of the column units 10 to correspond to each COL. The number of the sense amplifier units 301 (memory cell units MU) included in each COL 15 may be the same as the number of I/Os.

The COLs 15 are provided as COL#$15_0$, COL#$15_1$, ..., COL#$15_E$, $14_0$, ..., and COL#$0_E$ to correspond to the column units $10_0$, $10_1$, $10_2$, ... $10_{E-1}$, and $10_E$, respectively.

Each COL (also referred to as a column group) 15 corresponds to, for example, one byte of data in one page as shown in FIG. 3, and is equivalent to a control unit of 8 bit lines (8 memory cell units). Data is input to or output from the COL 15. For example, one column unit 10 includes 16 COLs 15. The number of the COLs 15 of the column unit 10 is not exclusively 16, and may be 8 or 32. Thus, each column unit 10 is a control group set to extend across the memory cell array 1 and the column control circuit. Each column unit 10 includes the memory cell units MU and the COLs 15.

Figure 4:
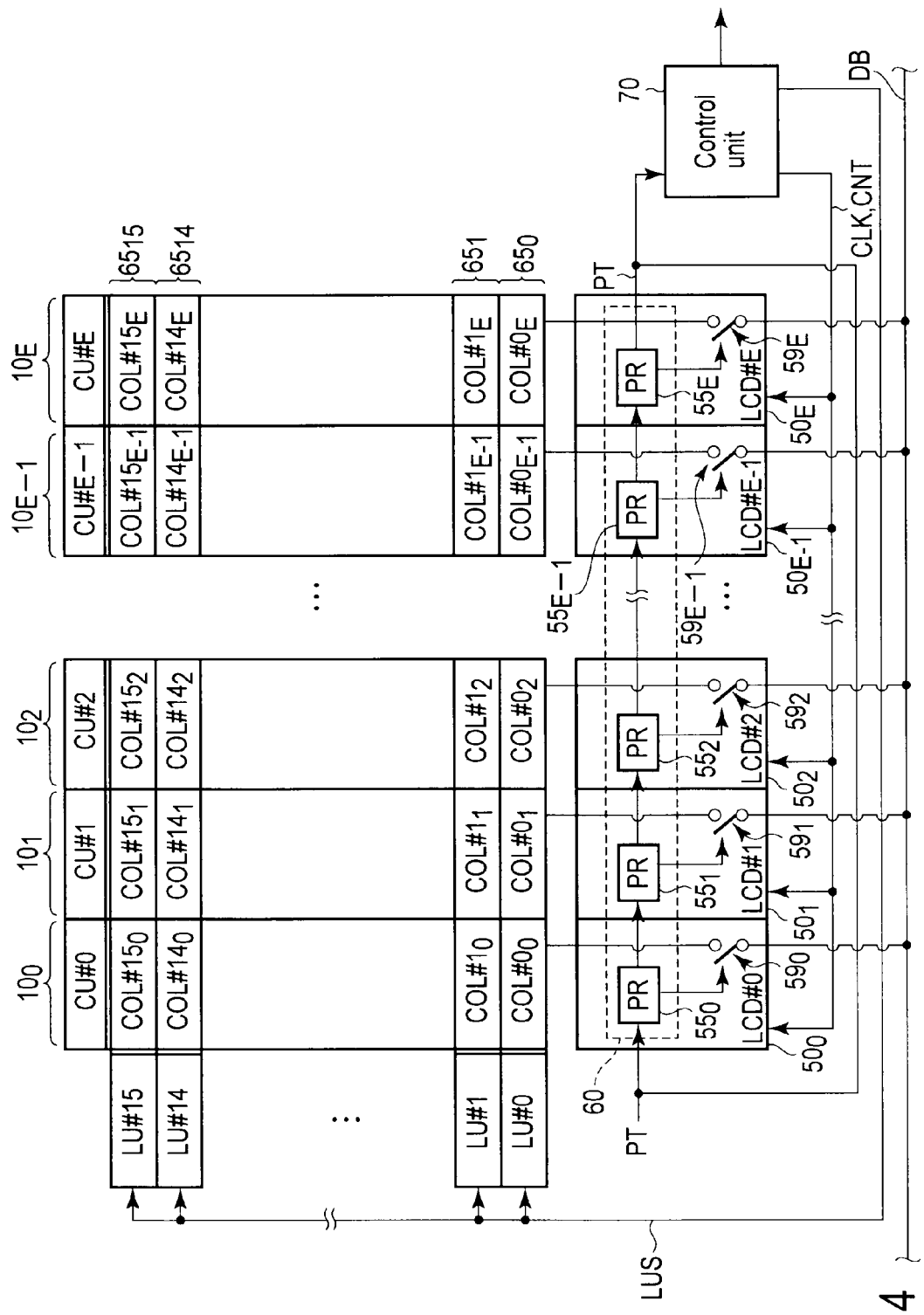
FIG. 4 is a diagram showing the internal configuration of the column control circuit of the semiconductor memory according to a first embodiment.

As shown in FIG. 4, the column units 10 are located to correspond to the local column decoders 50, respectively. In FIG. 4, the arrangement of the COLs 15 is schematically represented to show the relation between the column units and later-described loop units. This does not mean that the COLs are arranged as shown in FIG. 4 in an actual device.

For example, (E+1) column units 10 are provided in one memory cell array 1 and column control circuit 3, and (E+1) local column decoders 10 are provided in the column decoder 30. The number of the column units 10 set in the column of the memory cell array 1 is not particularly limited. The number of the column units 10 changes with the number of the COLs allocated to one column unit or with the number of the memory cells MC belonging to one page.

Each of the local column decoders 50 has one data bus switch (also referred to as a COL selection switch) $59_0$, $59_1$, $59_2$, ... $59_{E-1}$, or $59_E$. Hereinafter, the data bus switches $59_0$, $59_1$, $59_2$, ... $59_{E-1}$, and $59_E$ are represented by data bus switches 59 when not distinguished from one another. The data bus switches 59 include, for example, field effect transistors.

When the data bus switch 59 is turned on, a predetermined column unit 10 and COL 15 are connected to a data bus DB.

The conduction of the COL 15 and the data bus DBUS is controlled by the data bus switch 59. The data bus switch 59 is controlled by, for example, the local column decoder 50. The local column decoder 50 controls how the COL 15 and the data bus DBUS are connected via the data bus switch 59, in accordance with, for example, an address signal, a pointer register 55, and a clock.

In data input (writing) or data output (reading), a column address (physical column address) is input to the local column decoders 50 of the column decoder 30 via the address buffer 9. Each of the local column decoders 50 has an address decoding circuit. A pointer PT is set to the local column decoder 50 selected by the address decoding circuit.

The local column decoder 50 to which the pointer PT is set selects the corresponding column unit 10 and COL 15. More specifically, when the pointer PT is set to the local column decoder 50, the local column decoder 50 activates (turns on) the data bus switch 59. When the data bus switch 59 is turned on, the column unit 10 and the COL 15 are connected to the data bus DB.

Subsequently, the pointer PT loops across the local column decoders 50 until the operation for the selected page PG is completed.

Each pointer PT can be said to have a physical column address based on the selected local column decoder 50. For example, the pointer corresponding to one of column units 10 and COL 15 agrees with the physical column address corresponding to the one of column units 10 and COL 15.

Each of the local column decoders 50 has pointer registers $55_0$, $55_1$, ... $55_{E-1}$, and $55_E$.

The pointer registers $55_0$, $55_1$, ... $55_{E-1}$, and $55_E$ are provided to correspond to the column units $10_0$, $10_1$, ... $10_{E-1}$, and $10_E$, respectively. The pointer registers $55_0$, $55_1$, ... $55_{E-1}$, and $55_E$ receive a pointer PT, and temporarily hold the signal of the pointer PT. The pointer registers $55_0$, $55_1$, ... $55_{E-1}$, and $55_E$ are represented by pointer registers 55 when not distinguished from one another. Here, that "the pointer PT is set" means that the signal (e.g., an "H"-level signal) of the pointer PT is saved in the pointer register 55. The data bus switch 59 is turned on/off in accordance with the signal of the pointer held by the pointer register 55.

The pointer registers 55 form a shift register (register circuit) 60 between the first-stage local column decoder $50_0$ to the final-stage local column decoder $50_E$.

The pointer PT input to the local column decoder 50 is transferred (shifted) to the subsequent-stage local column decoder 50 by the control unit 70 in accordance with an operation timing. The pointer PT is shifted, the local column decoders 50 are sequentially selected. For example, the pointer PT is shifted across the local column decoders 50 synchronously with a clock CLK input to each of the local column decoders 50. For example, when the pointer PT sequentially moves across the local column decoders 50 synchronously with the clock CLK, the data holding status ("H" or "L" level) of the pointer register 55 of each of the local column decoders 50 changes.

The pointer PT sequentially moves across the local column decoders 50, and the column units 10 are sequentially selected. In this case, according to the present embodiment, a control unit formed of the COLs sequentially activated in a period in which the pointer PT is shifted from the first-stage local column decoder to the final-stage local column decoder is referred to as loop units $65_0, 65_1, \ldots, 65_{14}$, and $65_{15}$. The loop units $65_0, 65_1, \ldots, 65_{14}$, and $65_{15}$ are set to the column control circuit 3 (the COLs 15).

The loop units $65_0, 65_1, \ldots, 65_{14}$, and $65_{15}$ are formed to extend across, for example, the column units 10. The COLs 15 included in the loop units 65 are selected one by one from each of the column units 10. For example, the first (m-th) loop unit $65_0$ is formed of the COLs to which first (n-th) addresses are allocated in the respective column units 10. When one column unit 10 includes 16 COLs 15, 16 loop units $65_0$, $65_1, \ldots, 65_{14}$, and $65_{15}$, for example, are formed. The loop units $65_0, 65_1, \ldots, 65_{14}$, and $65_{15}$ are represented by loop units 65 when not distinguished from one another.

The number of the loop units set to the COLs in the column control circuit 3 is equal to the number of the COLs included in one column unit 10.

When the pointer PT reaches the final-stage local column decoder (LCD#E) $50_E$ and the input/output of the data in the column unit CU corresponding to the final-stage local column decoder is completed, the pointer PT is transferred to the first-stage (first) local column decoder (LCD#0) $50_0$. When the pointer PT reaches the final-stage local column decoder (LCD#E) $50_E$, the pointer PT is transferred to the control unit 70.

In the present embodiment, the movement path of the pointer is also referred to as a pointer loop path. The pointer loop path may be formed to pass through the control unit 70, or an input port of the pointer PT alone may be formed in the control unit 70.

For example, the local column decoder 50 or the pointer register 55 outputs, to the control unit 70, a signal that indicates the pointer PT or the holding status of the pointer PT.

The control unit (control signal generation circuit) 70 controls the operations of, for example, the loop units 65, the clock CLK, and the COLs 15 (and/or memory cell array) in accordance with the pointer PT input to the control unit 70 or the output signal of, for example, the local column decoder 50. The control unit 70 uses the pointer PT input to the control unit 70 to generate a signal CNT (e.g., a signal for incrementing the address of the loop units 65) for controlling the operations of the column decoder 30, the local column decoder 50, and the COLs 15 (and/or memory cell array).

For example, the control unit 70 controls the supply of the clock CLK to the local column decoder 50. For example, the clock CLK is input as a synchronous clock to each of the local column decoders 50 via the control unit 70. The pointer is moved across the local column decoders 50 synchronously with the clock CLK from the control unit 70.

The control unit 70 outputs the generated control signal CNT to the local column decoders 50 or the shift register 60.

In accordance with the pointer PT input to the control unit 70, the control unit 70 generates and outputs a control signal (selecting signal) for selecting a predetermined control unit (e.g., a loop unit) of the COLs 15.

For example, the pointer PT is input to the final-stage local column decoder (LCD#E) $50_E$. When the operation of the final-stage column unit (CU#E) $10_E$ corresponding to this local column decoder (LCD#E) $50_E$ is completed, the final-stage local column decoder (LCD#E) $50_E$ outputs a pointer PT#E. The pointer PT#E is transferred to the first-stage local column decoder $50_1$ via the pointer loop path, and also transferred to the control unit 70.

On receipt of the pointer PT#E from the final-stage local column decoder, the control unit 70 generates a signal (hereinafter referred to as a loop unit selecting signal) LUS for selecting the next-stage loop unit 65 to change the operation target (selection status) from the current loop unit to the next-stage loop unit. As a result, the loop unit 65 set to the column (or COL) of the flash memory is incremented to the next-stage loop unit 65. Thus, the address of the loop unit 65 and the COL 15 targeted for operation is shifted. The pointer PT is set to the first-stage local column decoder (LCD#0) substantially simultaneously with the shift of the address.

The control unit 70 may receive the pointer PT from the outside of the column control circuit 3, for example, at the start of the control of the COLs 15 (or column of the memory cell array). On the basis of this pointer, a signal for selecting the loop unit to be selected first at the start of the operation may be generated. The loop unit selecting signal LUS may be output to the loop unit 65 set to the COLs 15.

The local column decoder 50 controls the on/off of the data bus switch 59 in accordance with the loop unit selecting signal LUS. The local column decoder 50 not only controls the data bus switch but also controls the connection of the COL 15 belonging to the selected loop unit 65 and the data bus DBUS.

The address of the COLs 15 may be changed by decrementing the loop unit 65.

The control unit 70 can recognize the address of the currently selected column unit and the selected COL (column) by the pointer PT input to the control unit 70. The control unit 70 may identify the column unit 10 and the COL 15 currently targeted for operation by, for example, the input of a signal from the local column decoder 50 or the loop unit 65. The control unit 70 then outputs the pointer (pointer value) that indicates the column unit or COL targeted for operation to the control circuit 8 or some other circuit.

Thus, on the basis of the information (pointer value) from the column decoder 30, the peripheral circuit that forms the flash memory, the external memory controller, or the host can recognize which of the column units 10 or COLs 15 is currently targeted for operation. For example, the control circuit 8 may include a pointer-address conversion unit which converts the pointer and the physical address to transfer signals to/from the external memory controller.

The pointer PT sequentially moves in the shift register 60 synchronously with the clock CLK. Therefore, by using at least one of the position to which the pointer PT is set and the control signal (e.g., loop unit selecting signal) output by the control unit 70, the control unit 70 or the control circuit 8 may determine the pointer (physical column address) corresponding to the currently selected column unit and the selected COL in consideration of the input clock. For example, the control unit 70 or the control circuit 8 may detect the data holding status (e.g., "H" level) of the pointer register 55 and also detect the output loop unit selecting signal LUS, and thereby determine a physical column address from the pointer of the currently selected column unit 10 and the selected COL 15 by counting the input clock number.

The control unit 70 can also recognize that all the column units 10 and all the COLs 15 have been selected, for example, by a loop unit selecting signal LUS_END for selecting the loop unit $65_{15}$ corresponding to the last COL and by the pointer PT#E from the final-stage local column decoder $50_E$ corresponding to the final-stage column unit $10_E$.

The control unit 70 then outputs, to the control circuit 8, a signal (signal indicating the completion of the operation of the column) Sig_COLEND indicating that all the column units and COLs corresponding to the external address signal have been selected. Thus, the control circuit 8 can also recognize the completion of the operation of the COLS 15 (or column of the memory cell array) corresponding to a command and a predetermined address signal or the operation of the selected page PG. The control circuit 8 may have substantially the same function as the control unit 70 in the column decoder 30, and generate the pointer PT, generate the control signals CNT and LUS based on the pointer PT, and control the operation of the local column decoder 50.

In the flash memory according to the present embodiment, the operations and selection statuses of the column unit 10 including the COL 15 are controlled in accordance with the input/output of the pointer PT to/from the control unit 70.

Thus, the flash memory according to the present embodiment allows the COLs (sense amplifier units and data latch units of column control circuit) to be controlled in a relatively simple configuration. That is, an address can be determined by the position of the pointer PT. Moreover, which of the COLs 15 included in the column unit 10 is selected can also be determined by detecting the loop unit selecting signal LUS. As a result, there is no need for the pointer-address conversion, so that data can be input/output faster.

Furthermore, according to the flash memory of the present embodiment, the address of COLs (or the memory cell array 1) is judged by use of the pointer PT, so that no complicated circuit and no large-scale circuit (e.g., an address counter) have to be used. Consequently, the flash memory according to the present embodiment enables circuit simplification and the reduction of its manufacturing costs.

As described above, the features of the semiconductor memory according to the present embodiment can be improved.

(b) Operation

The operation of the semiconductor memory according to the first embodiment is described with reference to FIG. 5 to FIG. 8. Here, FIG. 1 to FIG. 4 are also used as needed to describe the operation of the flash memory according to the present embodiment.

Figure 5:
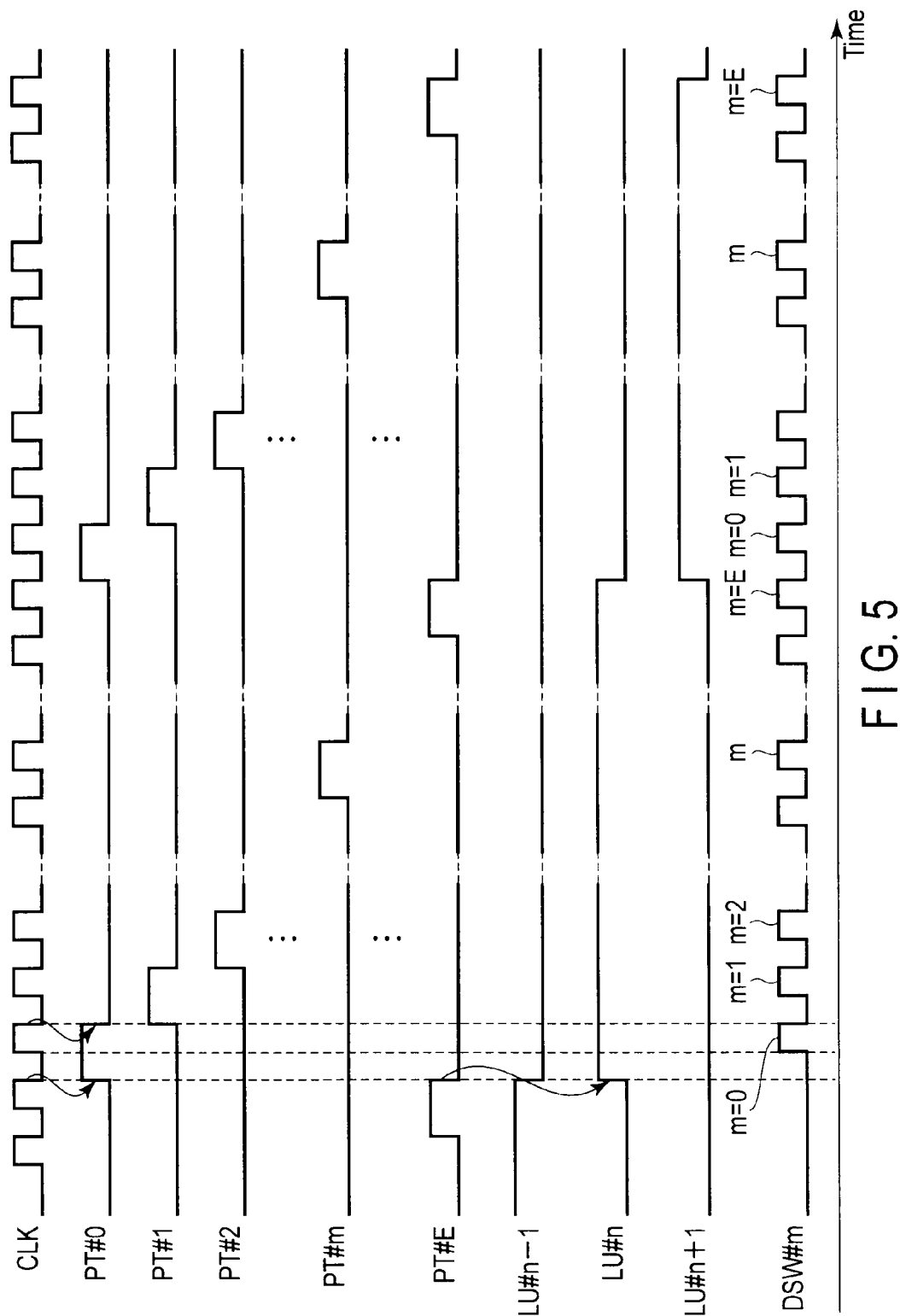
FIG. 5 is a timing chart showing the operation of the semiconductor memory according to the first embodiment.
Figure 6:
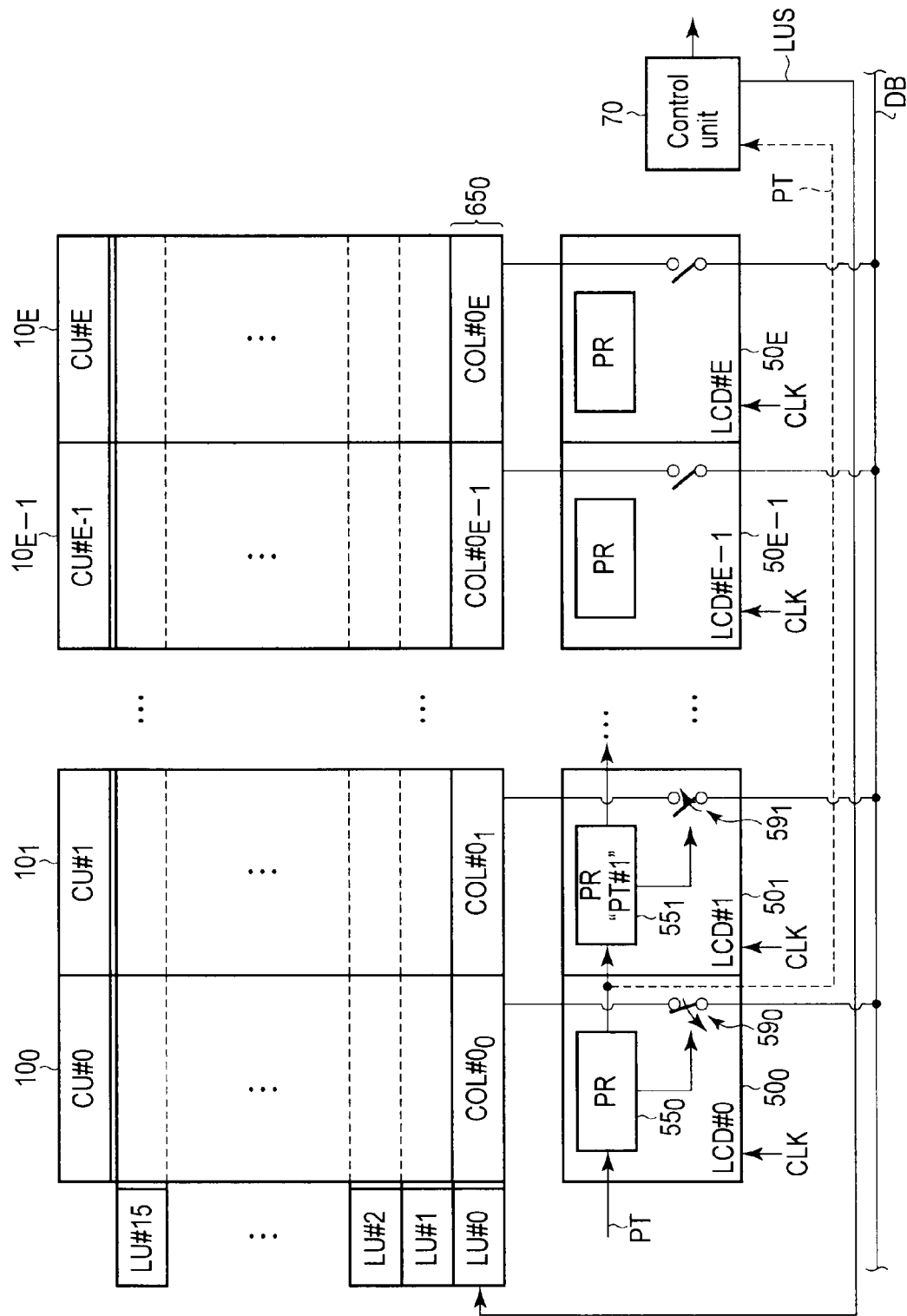
FIG. 6 is a diagram schematically showing the operation of the semiconductor memory according to the first embodiment.
Figure 8:
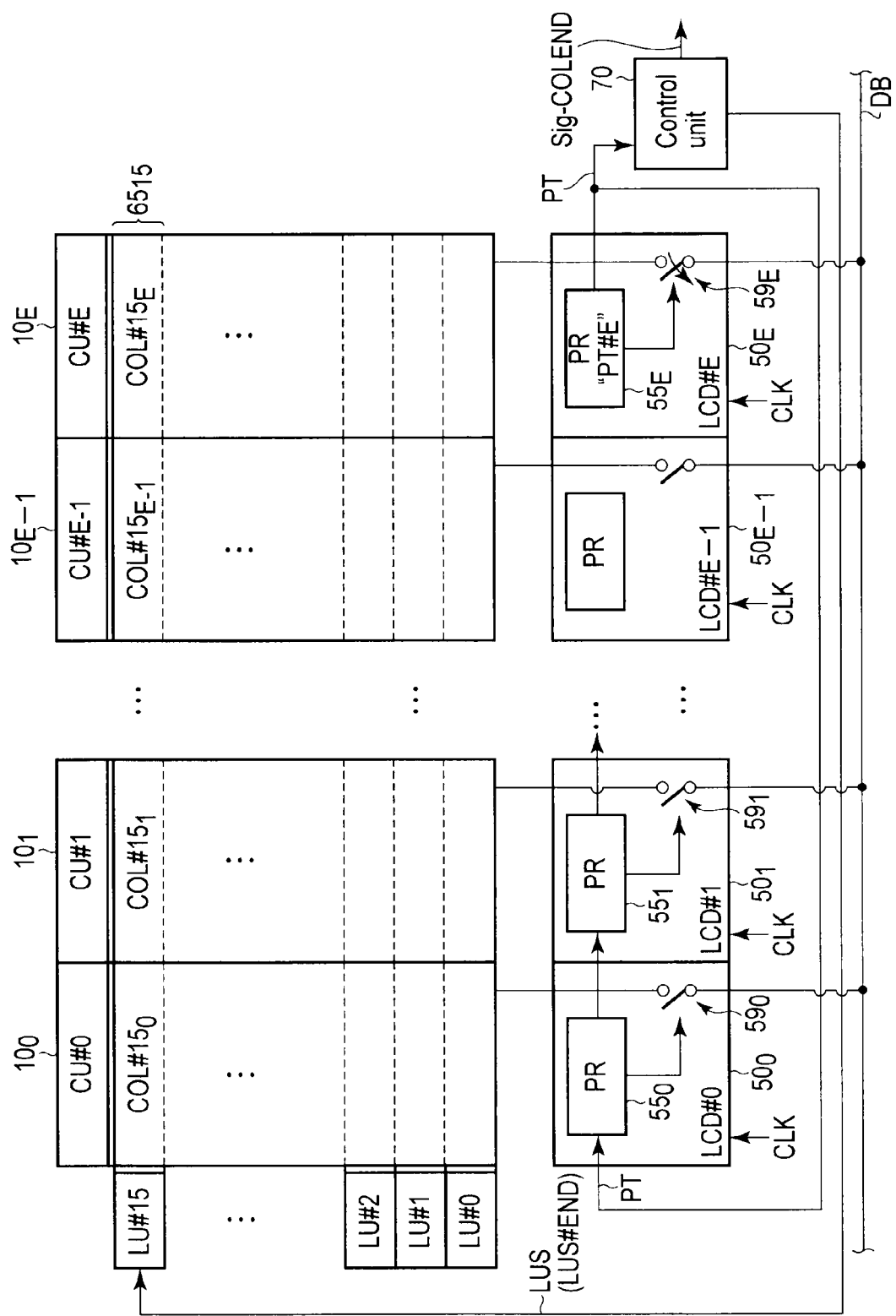
FIG. 8 is a diagram schematically showing the operation of the semiconductor memory according to the first embodiment.

FIG. 5 shows a timing chart of the operation of the flash memory according to the present embodiment. FIG. 6 to FIG. 8 are diagrams schematically showing the operation of the flash memory according to the present embodiment.

The operation of the flash memory according to the present embodiment mainly concerns the operation of the column control circuit 3 for inputting/outputting data to/from the memory cell array via the COL 15. The selection of the column by the column control circuit 3 only varies in the direction in which data is input to or output from the COL and the memory cell array 1 (column unit 10), and is substantially the same whether data is input to the memory cell array (memory writing operation) or data is output from the memory cell array (memory reading operation). Therefore, the memory writing operation/reading operations are not described in detail.

When there is an external (the controller OCH or the host OCH in FIG. 1) request to input data to or output data from the memory cell array 1, a write command or a read command is input to the control circuit 8 via the control signal input terminal 20A. Along with the input of this command, an address signal (physical address) is input to the address buffer 9 via the address signal terminal 20C. For example, when a write command is input, external data is input to the data input/output buffer 7 via the data input/output terminal 20B together with the command and the address signal.

In response to the input of the command and the address signal, the control circuit 8 drives the row control circuit 2 and the column control circuit 3. As a result, the block BLK, the page PG, the column unit CU(10), and the COL 15 indicated by the address signal are activated. For example, in data writing, one page of data is written into a predetermined address of the memory cell array 1 in the flash memory. Alternatively, in data reading, one page of data is read from a predetermined address in the flash memory. Therefore, the column units CU corresponding to one page PG are sequentially activated (selected) as operation targets in accordance with a predetermined timing and in a predetermined order.

The potential generation circuit 6 generates, for example, a write potential, a read potential, and an unselect potential in accordance with the input command. The source line control circuit 4 and the well control circuit 5 apply the potentials generated by the potential generation circuit 6 to the source line and a well.

The row control circuit 2 controls the row of the memory cell array 1 under the control (command) of the control circuit 8 and in accordance with the address signal. The row control circuit 2 activates the block (hereinafter, selected block) BLK and the page (hereinafter, selected page) PG indicated by the row address. The row control circuit 2 then transfers and applies predetermined potentials to a predetermined word line and the select gate line.

The column control circuit 3 controls the column of the memory cell array 1 under the control (command) of the control circuit 8 and in accordance with the address signal.

In the column decoder 30 within the column control circuit 3, one of local column decoders 50 is selected in accordance with the input of the column address. The pointer PT corresponding to the selected local column decoder 50 is set. The pointer PT may be generated by the address decoding circuit of the local column decoder 50 or by the control unit 70.

The signal (e.g., an "H"-level signal) of the pointer PT is sequentially moved through the pointer registers 55 corresponding to the respective column units 10 by the control unit 70 and the clock CLK.

An initial loop unit selecting signal LUS is generated by the control unit 70 (or the local column decoder to which the pointer is set) in accordance with the column address or the pointer. The loop unit selecting signal LUS is output to the local column decoder 50 from the control unit 70. A COL in the column unit is selected by the loop unit selecting signal LUS.

For example, when a write command is input, external data is transferred to each of the data latch units 302 in the page buffer circuit 32 as data to be written, together with a set of pointers for the local column decoder 50.

When the pointer PT is set, the column decoder 30 selects the column unit CU corresponding to the local column decoder 50 as a first operation target. The column decoder 30 then sequentially changes the selected column unit 10 and the selected COL 15 in accordance with the movement of the pointer PT across the local column decoders 50 (in the pointer loop path). As a result, the selected column unit 10 to be selected and the selected COL 15 to be selected move (switch).

In the case described here, the first column unit (CU#0) $10_0$ is selected by the address signal, and the first COL (the loop unit $65_0$) of this column unit $10_0$ is selected. It should be understood that the operation described below can also be performed when a column unit other than the first column unit or a COL (loop unit) other than the first COL is selected by the column address.

FIG. 6 schematically shows the operation from the point where the pointer PT is set to the first local column decoder $50_0$ to the point where the pointer PT is set to the second local column decoder $50_1$.

The pointer PT is set to the first (first-stage) local column decoder (LCD#0) $50_0$. At the same time, the loop unit selecting signal LUS from the control unit 70 is input to the local column decoder 50 so that the loop unit $65_0$ corresponding to the first COL (COL#0) 15 of each of the column units 10 is selected. The data holding status of the pointer register 55 of the local column decoder 50 is changed.

As shown in FIG. 5, the change of the data holding status of the pointer register 55 of each local column decoder 50 synchronizes with the clock CLK. For example, the data holding status of the pointer register 55 of the local column decoder (LCD#0) $50_0$ reaches the "H" level synchronously with the falling edge of the clock (first clock) CLK.

For example, the control unit 70 controls the supply of the clock CLK to the local column decoder 50. The clock CLK is input to each local column decoder 50 via the control unit 70. However, the clock CLK may be input to each local column decoder 50 without passing through the control unit 70.

As shown in FIG. 5 and FIG. 6, the pointer PT is set to the pointer register $55_0$ of the local column decoder $50_0$, and the data holding status (PT#0) of the pointer register $55_0$ changes to the "H" level. Synchronously with the succeeding rising edge of the clock CLK, an "H"-level control signal DSW#m (here, m=0) is input to the data bus switch $59_0$ corresponding to the selected COL 15 of the column unit (CU#0) $10_0$, and the data bus switch $59_0$ is turned on. As a result, a data input/output path between the predetermined COL 15 in the selected column unit $10_0$ and the data bus DB is conducted. For example, a signal level held by the pointer register 55 is input to the control terminal of the data bus switch 59 as a control signal DSW#m.

Data is input to or output from the selected COL (COL#0, 8 memory cells) 15 in the selected column unit $10_0$ in the period from the rising edge to the falling edge of the clock CLK. For example, the data (1-byte data belonging to one page) from the memory cell units MU of the memory cell array 1 input to the data latch unit 302 corresponding to the selected COL 15 is output to the data bus DB via the data bus switch $59_0$ in an on-state, in data reading.

Synchronously with the falling edge of the clock CLK, the data bus switch $59_0$ corresponding to the COL 15 in the column unit (CU#0) $10_0$ in which the input/output of the data is completed is turned off when the control signal DSW#m (m=0) changes to the "L"-level. As a result, the column unit (CU#0) $10_0$ is once deactivated.

Substantially simultaneously with the turning off of the data bus switch $59_0$ corresponding to the COL 15 in the column unit (CU#0) $10_0$, the pointer PT moves across the local column decoders 50.

That is, as shown in FIG. 5, the data holding status (PT#0) of the pointer register $55_0$ of the first-stage (first) local column decoder (LCD#0) $50_0$ changes to the "L" level synchronously with the rising edge of the clock (second clock) CLK.

Substantially at the same time, the data holding status (PT#1) of the pointer register $55_1$ of the next-stage (second) local column decoder (LCD#1) $50_1$ changes to the "H" level. As a result of the movement of the pointer PT, the second column unit $10_1$ is selected.

The control unit 70 can determine the column unit and COL currently targeted for operation by the loop unit selecting signal LUS and the output from the local column decoder 50. For example, by the signal that selects the loop unit $65_0$ corresponding to the first COL (COL#0) of each of the column units 10 and by the output signal from the local column decoder $50_0$ corresponding to the first column unit $10_0$, the control unit 70 can recognize that the column currently targeted for operation is the first column COL#0 in the second column unit $10_1$.

As shown in FIG. 5 and FIG. 6, the data bus switch $59_1$ in the second local column decoder (LCD#1) $50_1$ is turned on by a control signal DSW#1 synchronously with the rising edge of the clock CLK. The column unit (CU#1) $10_1$ corresponding to the data bus switch $59_1$ that is turned on is activated as a selected column unit, and the COL 15 belonging to the selected loop unit in the selected column unit (CU#1) $10_1$ is connected to the data bus.

Data is then input to or output from the first COL (COL#0) in the second column unit (CU#1) $10_1$.

After the completion of the operation of the second column unit (CU#1) $10_1$ as the selected column unit, the pointer PT moves across the pointer registers 55 that forms the shift register 60 in the second column unit (CU#1) $10_1$ and the third column unit (CU#2) $10_2$ synchronously with the falling edge of the clock CLK. It is same as in the changing (switching) of the selected column unit between the first column unit $10_0$ and the second column unit $10_1$. Along with the movement of the pointer PT, the data bus switch $59_1$ in the second local column decoder (LCD#1) $50_1$ is turned off by the control signal DSW#1. Further, the data bus switch of the third local column decoder (LCD#3) $50_3$ is turned on by a control signal DSW#2, and data is input to or output from the first COL (COL#0) in the third column unit (CU#3).

In this way, the control unit 70 generates the control signal (e.g., the loop unit selecting signal LUS) for the COL by using the pointer PT. Such column control operation by the control unit 70 using the pointer PT is performed by the sequential movement of the pointer PT across the local column decoders 50 (across the pointer registers 55 that forms the shift register 60) from the point where the pointer PT is input to the local column decoder $50_0$ corresponding to the first column unit indicated by the column address to the point where the pointer PT is input to the final-stage local column decoder $50_E$.

As described above, the pointer (physical column address) of the currently selected column unit and the selected COL can be determined by detecting the data holding status (e.g., "H" level) in the pointer register 55 of the shift register 60.

During the movement of the pointer PT in the shift register 60, a signal that indicates the movement or acquisition of the pointer PT may be output to the control unit 70 together with the input/output of the pointer PT to/from the pointer registers 55 in the shift register 60. Moreover, in accordance with the pointer PT and the input/output of the corresponding signal, the control unit 70 may inform other circuits (e.g., the control circuit 8) in the flash memory of the currently selected column unit and the selected COL. The control unit 70 and the control circuit 8 may recognize the address of the currently selected column unit and the selected column by the control signal (selecting signal) based on the pointer PT output by the control unit 70.

FIG. 7 schematically shows the operation from the point where the pointer PT is set to the final-stage local column decoder $50_E$ to the point where the pointer PT is looped (fed back) and set to the first local column decoder $50_0$.

As shown in FIG. 5 and FIG. 7, the pointer PT (PT#E) shifted by the shift register 60 is set to the pointer register $55_E$ in the final-stage local column decoder (LCD#E) $50_E$.

When the input/output of data to/from the first COL (COL#0) in the final-stage column unit (CU#E) is completed, the pointer PT#E is looped to the first-stage local column decoder $50_0$ from the final-stage local decoder $50_E$. At the same time, the pointer PT#E is output to the control unit 70.

Thus, the pointer PT which has reached the final-stage local decoder is returned to the first-stage (first) local column decoder (LCD#0) $50_0$ via the pointer loop path. The pointer PT from the final-stage local column decoder $50_E$ may be input to the control unit 70, and the control unit 70 may transfer the pointer PT to the first-stage local column decoder (LCD#0) $50_0$.

The pointer PT from the final-stage local column decoder $50_E$ is also input to the control unit 70. As a result, the control unit 70 generates the control signal (loop unit selecting signal) LUS to switch the currently loop unit 65 set to the column of the memory to the next-stage loop unit 65, and selects the next-stage loop unit. Therefore, the loop unit targeted for operation (selected loop unit) is switched (incremented) from the loop unit (LU#0) $65_0$ corresponding to the first COL (COL#0) to the loop unit (LU#1) $65_1$ corresponding to the second COL (COL#1).

The pointer PT fed back to the first local column decoder (LCD#0) $50_0$ is set to the pointer register $55_0$ of the local column decoder $50_0$.

As a result, the first column unit $10_0$ is selected by the local column decoder 50, and the selection switch of the COL belonging to the selected loop unit is turned on. Corresponding data is input to or output from the COL 15 belonging to the second loop unit $65_1$ of the column unit $10_0$.

The above-described switching operation of the local column decoder and the loop unit is sequentially repeated until the input/output of data to/from the final COL (COL#15) of the final-stage column unit (CU#E) $10_E$ is completed by the looping of the pointer in the local column decoder 50 (shift register 60) and by the generation of the control signal (loop unit selecting signal) in the control unit 70 to which the pointer is input.

FIG. 8 schematically shows the operation when the final loop unit $65_{15}$ set to the memory cell array 1 is selected and the pointer PT is set to the final-stage local column decoder $50_E$. As shown in FIG. 8, after the final loop unit $65_{15}$ is selected by the loop unit selecting signal LUS, the pointer PT is set to the final-stage local column decoder (LCD#E) $50_E$. Data is then input to or output from the final COL (COL#15) belonging to the final loop unit $65_{15}$.

In this case, the control unit 70 outputs, to the outside of the column control circuit 3 (e.g., the control circuit 8), a column selection end signal Sig_COLEND indicating that all the COLs (or bit lines) targeted for operation have been selected. For example, the control unit 70 generates the column selection end signal Sig_COLEND in accordance with the loop unit selecting signal LUS (LUS#END) for selecting the final loop unit $65_{15}$ including the COLs 15 and in accordance with the pointer PT (PT#E) output to the control unit 70 from the final-stage local column decoder (LCD#E) $50_E$.

The control circuit 8 receives the column selection end signal Sig_COLEND from the control unit 70. As a result, the control circuit 8 detects the completion of the operation corresponding to the column unit 10 and the COL 15 corresponding to the address signal or the operation for the selected page PG. For example, the control circuit 8 informs the memory controller and the host of the completion of the operation in accordance with the signal Sig_COLEND.

The input/output of data (writing operation or reading operation) in the flash memory according to the present embodiment ends with the operation described above.

As in the operation described with reference to FIG. 5 to FIG. 8, the pointer based on the external address signal is input to the control unit 70 in the column control circuit 3 in the flash memory according to the present embodiment. The control unit 70 then generates the signals CNT and LUS for controlling the column of the memory cell array 1 in accordance with the input pointer. In accordance with the control signals CNT and LUS generated on the basis of the input/output of the pointer, the column control circuit 3 controls the operation of the COLs 15 (or column of the memory cell array).

The operation of the flash memory according to the present embodiment described above allows the column of the memory cell array to be controlled in a relatively simple small-scale circuit configuration, and enables faster data input/output.

(c) Conclusion

The semiconductor memory (e.g., flash memory) according to the first embodiment includes the column control circuit 3 having the control unit 70 to which the pointer PT corresponding to an external address signal is input. In accordance with the pointer PT input to the control unit 70, the control unit 70 generates a signal for controlling the COL (column group) 15 as a control unit of column of flash memory.

Heretofore, a counter circuit (address counter) has been used in a column control method for the flash memory. An address in which the pointer is present is determined by count-up operation in the address counter based on a clock. In the conventional column control method for the flash memory, a control signal for the COL (sense amplifier units and data latch units) is generated in accordance with the counting result (counted number).

According to the column control method using the address counter in the flash memory, the timing margin for the counting operation of the address counter regarding the fast data input/output operation in the memory may decrease. As a result, the high-speed operation of the memory may be deteriorated by allowing the timing margin for the counter operation.

In contrast, in the flash memory according to the present embodiment, the selected column unit is sequentially changed by the movement of the pointer PT synchronous with the clock CLK without the use of the address counter. The control unit 70 then detects a physical address in accordance with the pointer PT.

Therefore, the operation of the flash memory according to the present embodiment is not pressed by the timing margin allowed for the counting operation. Thus, the flash memory according to the present embodiment enables faster data input/output operation.

When the address counter is used, the timing for outputting a column control signal changes with the number of the column units 10. Therefore, the address counter may be redesigned whenever the column configuration of the memory cell array is changed in accordance with specifications required by a user. Moreover, the address counter has a complicated circuit configuration and has a large circuit scale.

In contrast, the flash memory according to the present embodiment detects the selected column unit 10 on the basis of the setting of the pointer PT to the local column decoder 50, the movement of the pointer PT in the shift register 60 formed of the pointer registers 55 in the local column decoder 50, and the input of the pointer PT to the control unit 70. Further, a predetermined column unit and COL (column or bit line) are selected by the active local column decoder 50 and loop unit 65, and the column unit 10 and the COL 15 are controlled.

Thus, the flash memory according to the present embodiment can select (switch) the column unit of the memory cell array without using a large-scale counter circuit (address counter).

Even when there are changes in the number of the column units 10, the number of the COLs (column groups) in the column unit 10, or the number of the bit lines BL (the number of columns), the flash memory according to the present embodiment can control the COLs (or column of the memory) by changing the output position of the pointer PT and thus transferring the pointer PT to the control unit 70. Therefore, the flash memory according to the present embodiment allows the design of the column control circuit to be simple.

In particular, increasing storage density of the flash memory, the circuit scale of the address counter also increases with the increase of the storage density. It is therefore preferred in respect of the simplification of circuits, the flexibility of circuit designs, and the reduction of a chip size that the column can be controlled (selected) by a circuit having a relatively simple configuration and by a circuit having a reduced scale as in the flash memory according to the present embodiment.

As described above, the operation characteristics of the semiconductor memory according to the present embodiment can be improved.

(2) Second Embodiment

A semiconductor memory (e.g., flash memory) according to the second embodiment and its operation are described with reference to FIG. 9 and FIG. 10. The configuration and operation similar to those in the first embodiment are described when necessary.

A memory cell array and COLs may be separated into logical regions (hereinafter referred to as column regions), and the operation of the COL (or column of memory) may be controlled for each of the separate column regions.

Figure 9:
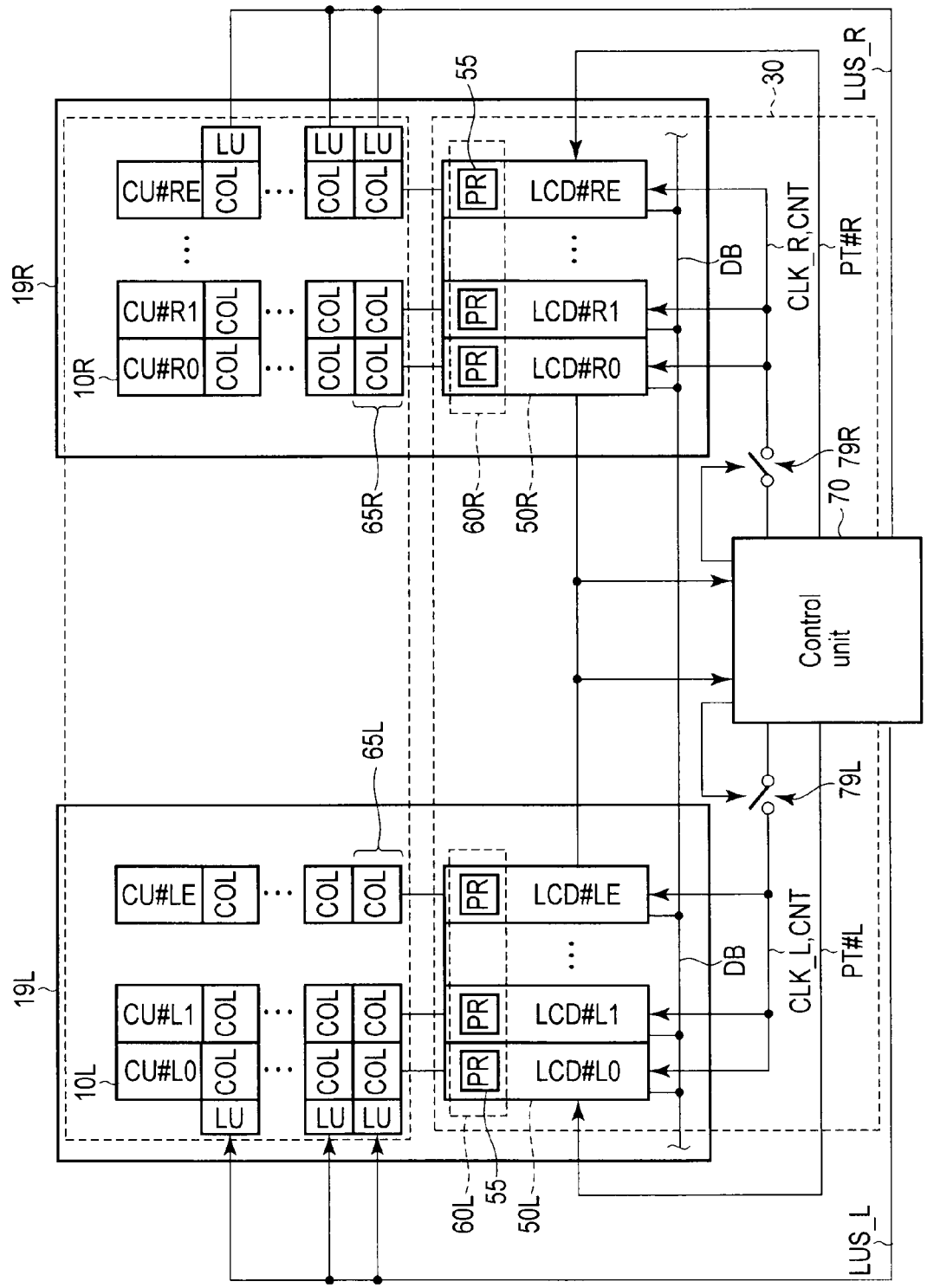
FIG. 9 is a diagram illustrating the configuration of a semiconductor memory according to a second embodiment.

For example, as shown in FIG. 9, a memory cell array 1 of the flash memory according to the present embodiment includes two column regions 19L and 19R logically separate in a row direction (or a column direction). Here, for clarity of explanation, of the two logical column regions 19L and 19R set in the memory cell array 1 and a corresponding column control circuit 3, one column region 19L is referred to as a left column region 19L, and the other column region 19R is referred to as a right column region 19R. Which of the two column regions 19L and 19R is selected is determined by a most significant bit of a column address or by a determination bit included in an address signal.

The left column region 19L includes column units 10L. The right column region 19R includes column units 10R. As in the first embodiment, local column decoders 50L and 50R are provided in the respective column regions 19L and 19R to correspond to the respective column units 10L and 10R. The number of the column units 10L included in the left column region 19L is preferably the same as the number of the column units 10R included in the right column region 19R. As in the first embodiment, loop units 65L and 65R are set in the left column region 19L and the right column region 19R, respectively.

As in the first embodiment, the local column decoders 50L and 50R have shift registers 60L and 60R formed of pointer registers 55, respectively. In the respective column regions 19L and 19R, the shift registers 60L and 60R formed of the pointer registers 55 are formed to extend across the local column decoders 50L and 50R.

A control unit 70 is shared by the left/right column regions 19L and 19R. The control unit 70 supplies a clock CLK_L to the local column decoders 50L in the left column region 19L. The supply of the clock CLK_L to the left column region 19L is controlled by a clock supply switch (e.g., field effect transistor) 79L. The control unit 70 supplies a clock CLK_R to the local column decoders 50R in the right column region 19R. The supply of the clock CLK_R to the right column region 19R is controlled by a clock supply switch 79R.

The control unit 70 receives pointers PT#L and PT#R for the left column region 19L and the right column region 19R. For example, the control unit 70 outputs the pointers PT#L and PT#R to the local column decoders 50L and 50R corresponding to the column regions 19L and 19R, respectively.

The operation of the flash memory according to the present embodiment is described with reference to FIG. 10. FIG. 10 shows a timing chart of the operation of the flash memory according to the present embodiment.

Figure 10:
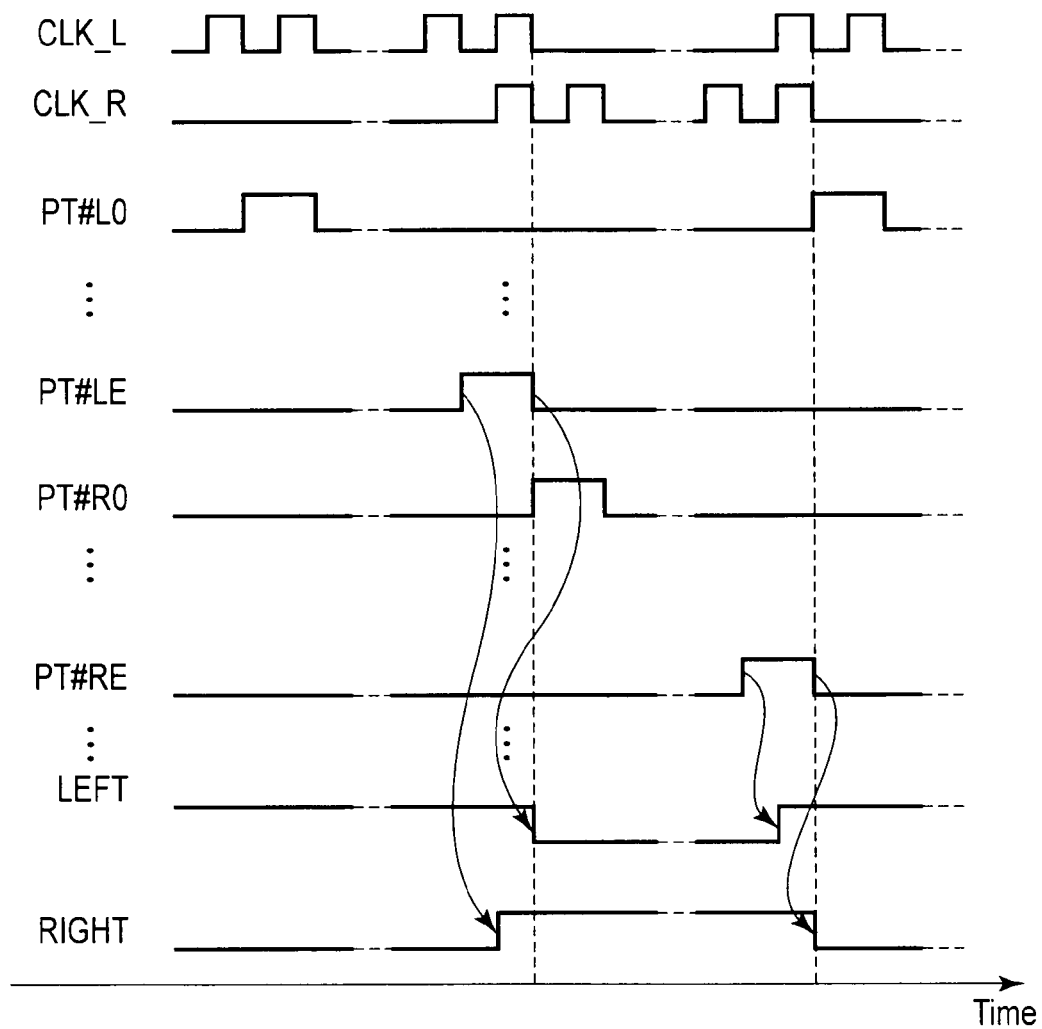
FIG. 10 is a timing chart showing the operation of the semiconductor memory according to the second embodiment.

For example, as shown in FIG. 10, when the left column region 19L is selected as an operation target by an external address signal from the external (memory controller OCH or host OCH), the control unit 70 turns on the clock supply switch 79L of the left column region 19L. As a result, the clock CLK_L is supplied to the left column region 19L via the control unit 70.

When the left column region 19L is selected, the control unit 70 turns off the clock supply switch 79R of the right column region 19R. Thus, when the clock CLK_L for the left column region 19L is supplied, the clock CLK_R is not supplied to the right column region 19R.

In the left column region 19L, a pointer PT#L0 is set to a predetermined local column decoder (LCD#L0) 50L synchronously with the rising edge of the clock CLK_L. Further, in the left column region 19L, the column unit (CU#L0) 10L corresponding to the local column decoder (LCD#L0) 50L is selected (activated). Data is input to or output from a predetermined COL (e.g., COL#0) in the selected column unit (CU#L0) 10L.

Substantially as in the operation described with reference to FIG. 4 to FIG. 7 in the first embodiment, in the shift register 60L formed of the pointer registers 55, the pointer PT#L is sequentially shifted synchronously with the supplied left clock CLK_L. As a result, the local column decoders 50L in the left column region 19L are sequentially switched, and the respective column units 10L in the left column region 19L are selected in an order. Data is input to or output from the COL belonging to a loop unit of the selected column unit.

The control unit 70 then detects that a pointer PT#LE is input to the final-stage local column decoder (LCD#LE) 50L of the left column region 19L. The control unit 70 uses this pointer PT#LE to control the stopping of the supply of the clock CLK_L to the left column region 19L and the start of the supply of the clock CLK_R to the right column region 19R.

For example, the control unit 70 turns on the clock supply switch 79R of the right column region 19R synchronously with the input of the pointer PT#LE to the final-stage local column decoder (LCD#LE) of the left column region 19L (the rising edge of the pointer PT#LE) or in a period in which the final-stage local column decoder (LCD#LE) is holding the pointer PT#LE. Accordingly, the clock CLK_R is supplied to the right column region 19R.

The control unit 70 turns off the clock supply switch 79L of the left column region 19L synchronously with the falling edge of the pointer PT#LE. Accordingly, the supply of the clock CLK_L to the left column region 19L is stopped.

In this way, the control (operation) of the left column region 19L is stopped, and the control (operation) of the right column region 19R is started.

As in the operation of the left column region 19L, a pointer PT#R0 is then set to a predetermined local column decoder (LCD#R0) 50R in the right column region 19R synchronously with the fall of the clock CLK_R. Data is input to or output from a COL#R in a predetermined column unit 10R of the right column region 19R.

In the right column region 19R, the pointer PT#R is then sequentially transferred to the subsequent-stage local column decoders 50R by the shift register 60R synchronously with the supplied clock CLK_R. The column units 10R of the right column region 19R are sequentially selected along with the movement of the pointer PT#R. Data is input to or output from the COLs belonging to a loop unit 65R.

When the pointer PT#RE reaches the final-stage local column decoder (LCD#RE) 50R of the right column region 19R, the control unit 70 turns off the clock supply switch 79R of the right column region 19R. Accordingly, the supply of the clock CLK_R to the right column region 19R is stopped.

Subsequently, if the left column region 19L is targeted for operation, the control unit 70 generates control signals CNT and LUS in accordance with the input of a pointer from the right region 19R. Further, as in the operation described above, under the control of the control unit 70, the clock CLK_L is supplied to the left column region 19L, the local column decoder 50L of the left column region 19L is driven, and the column unit 10L is selected.

Thus, the control unit 70 generates the control signals CNT and LUS by using the pointers PT#L and PT#R corresponding to the final-stage column decoders of the column regions 19L and 19R. The selection of the logical regions 19L and 19R allocated to the COLs (or the column of the memory cell array 1) and the supply of the clocks CLK_L and CLK_R are controlled by the generated control signals CNT and LUS.

The column selection end signal Sig_COLEND mentioned in the first embodiment may be used to switch between the left column region 19L and the right column region 19R. Data may be input to or output from the column units 10R in the right column region 19R after data has been input to or output from all the column units 10L and COL in the left column region 19L.

One memory cell array in one chip is separated into two logical regions in the example shown in the present embodiment. Operation described with reference to FIG. 9 and FIG. 10 may be performed for more than one memory cell array in one chip or for memory cell arrays in more than one chip.

In the flash memory according to the present embodiment, the memory cell array 1 is separated into the regions (logical regions) 19L and 19R, and the corresponding COLs is controlled for each of the regions 19L and 19R. Thus, the supply of a clock or a voltage/current to the region 19L or 19R that is not accessed can be stopped. Consequently, the flash memory according to the present embodiment can provide advantages described in the first embodiment and its power consumption can be reduced.

As described above, the operating characteristics of the semiconductor memory according to the second embodiment can be improved.

[Addition]

While the flash memory is shown as an example of a semiconductor memory in the present embodiment, the present embodiment is also applicable to any memory such as a magnetoresistive RAM (MRAM), a resistive RAM (ReRAM), and a phase change RAM (PCRAM) as long as the method of controlling the column of the memory cell array is substantially the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
    a memory cell array which comprises memory cells, the memory cells being arranged along a row direction and a column direction and storing data respectively corresponding to thresholds;
    a row control circuit which controls a row of the memory cell array; and
    a column control circuit which includes a control unit, the control unit generating a signal to control elements corresponding to a column of the memory cell array in accordance with a pointer corresponding to an external address signal,
    wherein the memory cell array and the column control circuit comprise column units including column groups and loop units including the column groups and set to extend across the column units,
    the column units are a control group set to the column control circuit,
    the column groups included in one loop unit are selected one by one from the column units belonging to the loop unit,
    the column control circuit sequentially activates column groups in a selected loop unit synchronously with a shift of the pointer across the column units, and
    the column control circuit switches a loop unit targeted for operation from the selected loop unit to a loop unit to be selected next after the column groups in the selected loop unit are sequentially activated, and the column control circuit sequentially activates column groups in the loop unit to be selected next synchronously with the shift of the pointer.

2. The semiconductor memory according to claim 1, wherein
    the column control circuit comprises local column decoders corresponding to the column units respectively, the pointer is input to or output from the local column decoders.

3. The semiconductor memory according to claim 2, wherein
    each of the local column decoders include a register which holds the pointer, and
    the registers form a shift register.

4. The semiconductor memory according to claim 1, wherein
    the control unit outputs a control signal to change a loop unit targeted for operation among the loop units in accordance with the pointer.

5. The semiconductor memory according to claim 4, wherein
    the control signal is generated in accordance with a pointer that indicates a final-stage column unit among the column units belonging to one loop unit.

6. The semiconductor memory according to claim 2, wherein
    the control unit generates a signal indicating the end of the column selection in the column groups in accordance with a pointer output from the final-stage local column decoder and in accordance with a signal indicating that the final loop unit is selected.

7. The semiconductor memory according to claim 1, wherein the control unit sets the pointer to a local column decoder selected by the address signal among local column decoders included in the column control circuit.

8. The semiconductor memory according to claim 1, wherein a physical column address included in the address signal corresponds to an address indicated by the pointer.

9. The semiconductor memory according to claim 1, wherein the memory cell array and the column groups include logical regions, the control unit stops the supply of a clock to a logical region targeted for operation among the logical regions after the completion of the operation of the selected column units in the logical region targeted for operation, and the control unit transfers the pointer to a next logical region targeted for operation, and the control unit supplies a clock to the next logical region targeted for operation.

10. The semiconductor memory according to claim 1, wherein each of the column groups includes memory cells respectively connected to bit lines, sense units respectively connected to the bit lines, and latches respectively connected to the sense units.

11. The semiconductor memory according to claim 1, wherein discontinuous addresses are allocated to the column groups included in each of the column units, continuous addresses are allocated to the column groups included in each of the loop units.

12. A semiconductor memory control method comprising:

inputting a physical column address included in an external address signal to a column control circuit which controls a column of a memory cell array including memory cells, the memory cell array and the column control circuit comprising column units including column groups, and loop units including the column groups and set to extend across the column units, the column units being a control group set to the column control circuit, and the column groups included in one loop unit being selected one by one from the column units belonging to the loop unit;

generating a pointer from the physical column address;

controlling the column of the memory cell array in accordance with the pointer, activating sequentially column groups in a selected loop unit synchronously with a shift of the pointer across the column units; and switching a loop unit targeted for operation from the selected loop unit to a loop unit to be selected next after the column groups in the selected loop unit is sequentially activated, and activating sequentially column groups in the loop unit to be selected next synchronously with the shift of the pointer.

13. The semiconductor memory control method according to claim 12, wherein the column control circuit includes local column decoders corresponding to the column units respectively, the pointer is input to or output from the local column decoders.

14. The semiconductor memory control method according to claim 12, wherein a signal to change a loop unit targeted for operation among the loop units in accordance with the pointer is output from the column control circuit.

15. The semiconductor memory control method according to claim 13, wherein the pointer is set to a local column decoder selected by the address signal among the local column decoders by the column control circuit.

16. The semiconductor memory control method according to claim 12, wherein the physical column address corresponds to an address indicated by the pointer.

17. The semiconductor memory control method according to claim 12, wherein discontinuous addresses are allocated to the column groups included in each of the column units, continuous addresses are allocated to the column groups included in each of the loop units.

* * * * *